(12) United States Patent
Belousov et al.

(10) Patent No.: US 8,642,140 B2
(45) Date of Patent: Feb. 4, 2014

(54) CERAMIC COATING DEPOSITION

(75) Inventors: Igor V. Belousov, Kyiv's Region (UA);
Yuriy G. Kononenko, Kyiv (UA);
Anatoly Kuzmichev, Kiev (UA);
Leonid Shaginyan, Kiev (UA); Michael J. Maloney, Marlborough, CT (US);
John F. Mullooly, Jr., Oklahoma City, OK (US)

(73) Assignee: United Technologies Corporation, Hartford, CT (US)

( * ) Notice: Subject to any disclaimer, the term of this patent is extended or adjusted under 35 U.S.C. 154(b) by 0 days.

(21) Appl. No.: 13/043,948

(22) Filed: Mar. 9, 2011

(65) Prior Publication Data
US 2012/0231173 A1    Sep. 13, 2012

(51) Int. Cl.
*H05H 1/24* (2006.01)

(52) U.S. Cl.
USPC ...... 427/569; 427/576; 427/597; 118/723 EB (58) Field of Classification Search
USPC ............... 427/569, 597, 576; 118/723 EB
See application file for complete search history.

(56) References Cited

U.S. PATENT DOCUMENTS

| | | | | |
|---|---|---|---|---|
| 5,652,044 | A * | 7/1997 | Rickerby | 428/216 |
| 5,736,073 | A | 4/1998 | Wadley et al. | |
| 5,763,107 | A | 6/1998 | Rickerby et al. | |
| 5,846,605 | A | 12/1998 | Rickerby et al. | |
| 5,846,608 | A * | 12/1998 | Neumann et al. | 427/529 |
| 5,981,091 | A | 11/1999 | Rickerby et al. | |
| 6,025,078 | A | 2/2000 | Rickerby et al. | |
| 6,057,047 | A | 5/2000 | Maloney | |
| 6,110,604 | A | 8/2000 | Rickerby | |
| 6,183,884 | B1 | 2/2001 | Rickerby | |
| 6,376,015 | B1 | 4/2002 | Rickerby | |
| 6,478,931 | B1 | 11/2002 | Wadley et al. | |
| 7,556,695 | B2 | 7/2009 | Strangman et al. | |
| 2004/0118347 | A1 * | 6/2004 | Groves et al. | 118/723 EB |
| 2006/0278518 | A1 | 12/2006 | Kouznetsov | |
| 2008/0057254 | A1 * | 3/2008 | Memmen et al. | 428/63 |
| 2008/0220177 | A1 | 9/2008 | Hass et al. | |
| 2010/0196684 | A1 | 8/2010 | Memmen et al. | |

FOREIGN PATENT DOCUMENTS

| | | |
|---|---|---|
| EP | 0705912 A2 | 4/1996 |
| GB | 2226334 A | 6/1990 |
| JP | 2003073814 A | 3/2003 |
| JP | 2004076069 A | 3/2004 |
| WO | 03/028428 A2 | 4/2003 |
| WO | 2010/069912 A1 | 6/2010 |

OTHER PUBLICATIONS

J.R. Nicholls et al., Methods to Reduce the Thermal Conductivity of EB-PVD TBC's, Surface and Coatings Technology, vols. 151-152, Mar. 2002, pp. 383-391.
EP Search Report for EP Patent Application No. 12158385.0, dated Jul. 26, 2012.

* cited by examiner

*Primary Examiner* — Elizabeth Burkhart
(74) *Attorney, Agent, or Firm* — Bachman & LaPointe, P.C.

(57) ABSTRACT

A material is applied to a part. The part is placed in a deposition chamber and a first electric potential is applied to the part. Components are evaporated for forming the material. The evaporated components are ionized. The first electric potential is modulated so as to draw the ionized component to the part. The modulation comprises a plurality of first steps for PA-PVD. Each of the first steps comprises a series of pulses of negative potential. The modulation further comprises a plurality of second steps for PVD alternating with the first steps.

19 Claims, 6 Drawing Sheets

CERAMIC COATING DEPOSITION

BACKGROUND

The disclosure relates to gas turbine engines. More particularly, the disclosure relates to thermal barrier coatings for gas turbine engines.

Gas turbine engine gaspath components are exposed to extreme heat and thermal gradients during various phases of engine operation. Thermal-mechanical stresses and resulting fatigue contribute to component failure. Significant efforts are made to cool such components and provide thermal barrier coatings to improve durability.

Exemplary thermal barrier coating systems include two-layer thermal barrier coating systems. An exemplary system includes a NiCoCrAlY bond coat (e.g., low pressure plasma sprayed (LPPS)) and a yttria-stabilized zirconia (YSZ such as 7YSZ) thermal barrier coat (TBC). While the TBC layer is being deposited or during an initial heating cycle, a thermally grown oxide (TGO) layer (e.g., alumina) forms atop the bond coat layer. As time-at-temperature and the number of cycles increase, this TGO interface layer grows in thickness. U.S. Pat. Nos. 4,405,659 and 6,060,177 disclose exemplary systems.

Exemplary TBCs are applied to thicknesses of 0.05-1.0 mm and can provide in excess of 300° F. temperature reduction to the base metal (e.g., a Ni- or Co-based superalloy). This temperature reduction translates into improved part durability, higher turbine operating temperatures, and improved turbine efficiency.

U.S. Pat. No. 5,652,044, the disclosure of which is incorporated by reference in its entirety herein as if set forth at length, discloses a system for forming alternating TBC layers by switching between a plasma assisted physical vapor deposition (PA-PVD) mode and a non-plasma assisted physical vapor deposition (PVD) mode. During PA-PVD stages, plasma ions bombard the surface of coated TBC and introduce modifications into TBC microstructure, which affect TBC thermal conductivity. Namely, sharp transitions from the microstructure of one deposition mode to the microstructure of the other deposition mode strongly influence the TBC thermal conductivity due to scattering of providing thermal conductivity phonons and photons on the transitions (that is on interfaces between the microstructures). The alternating stages are of approximately equal duration. In one experiment, the layers of both modes were 2 μm; in another, the PVD layers were 2 μm and the PA-PVD layers were 1 μm. The equal thickness combination was identified as having a lower thermal conductivity than the unequal thickness combination and the respective single mode coatings.

SUMMARY

One aspect of the disclosure involves a method for applying a material to a part. The method comprises placing the part in a deposition chamber and applying a first electric potential to the part. Components are evaporated for forming the material. The evaporated components are ionized. The first electric potential is modulated so as to draw the ionized component to the part. The modulation comprises a plurality of first steps for PA-PVD. Each of the first steps comprises a series of pulses of negative potential. The modulation further comprises a plurality of second steps for PVD alternating with the first steps.

The details of one or more embodiments are set forth in the accompanying drawings and the description below. Other features, objects, and advantages will be apparent from the description and drawings, and from the claims.

BRIEF DESCRIPTION OF THE DRAWINGS

Like reference numbers and designations in the various drawings indicate like elements.

DETAILED DESCRIPTION

Figure 1:
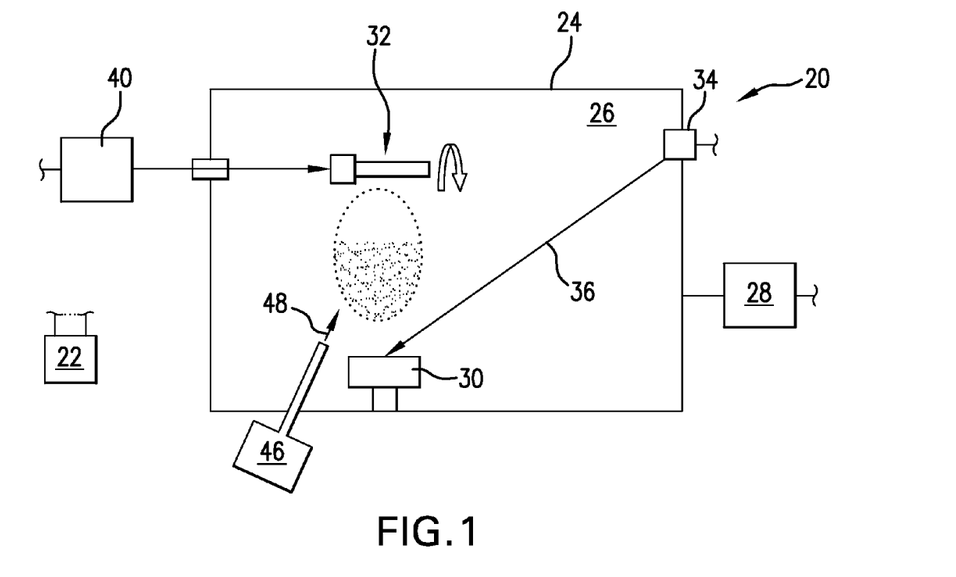
FIG. 1 is a partially schematic view of a coating system.

FIG. 1 shows an exemplary deposition system 20. Mechanically/electrically, the system 20 may represent any of numerous presently-available or subsequently designed systems. The system 20 has a controller 22 (e.g., a microcontroller or microcomputer) which, similarly, may be programmed or otherwise configured as is a present or subsequent controller; however, with further modification (discussed below). An exemplary system is based on that of U.S. Pat. No. 5,652,044 (the '044 patent). The PVD intervals (more particularly electron beam PVD or EB-PVD) may be similar to those of the '044 patent. The exemplary system has further modifications to the PA-PVD intervals (also known as ion-enhanced electron beam physical vapor deposition (IE-EB-PVD)) of the '044 patent. An exemplary system 20 includes a chamber 24 having an interior 26 coupled to a vacuum source 28. Sources of inert and/or reactive gases are possible in system variations. A ceramic ingot 30 forms a source of material for a coating to be applied to a substrate (e.g., a superalloy turbine engine component 32 such as a blade, vane, combustor panel, or the like). An electron beam gun 34 is positioned to direct an electron beam 36 to a surface of the ingot for evaporating the ingot. A generator 40 is coupled to the substrate 32 for applying a DC and/or RF bias to the substrate. The pulse generator 40 may replace a baseline generator (e.g., of the '044 patent) if the latter is incapable of pulse operation. For example, the baseline generator may be on-off controlled to produce a longer duration source wave but lacking ability to pulse at durations much less than one second. A source 46 of a reactive gas flow 48 is shown coupled to the chamber. The reactive gas may serve as a make-up for components lost from the ingot 30. For example, in the case of a YSZ (zirconia $ZrO_2$+Y for stabilization) ingot, the gas may be oxygen to replace oxygen lost from the ingot. For example, zirconia during EB evaporation loses some oxygen atoms because of partial dissociation of zirconia under high-energy electron bombardment. So, in the space between the ingot 30 and the substrate 32, there are vapor with chemical formula $ZrO_x$ (x<2) and free oxygen atoms. The latter, being light particles, are disproportionately pumped out from the interior chamber 26 by the vacuum source 28. Thus, mainly vapor molecules $ZrO_x$ would reach the substrate 32 to form a deposit (coating) with non-stoichiometric formula and likely undesirable features. In order to increase oxygen content in the coating up to stoichiometric level due to chemical reaction of $O_2$ with $ZrO_x$ on the substrate surface, one directs the additional free oxygen flow 48 into the chamber 24 toward the substrate. Such an approach is referred to as reactive evaporation deposition. Ionization (and accompanying excitation) of reactive gas (e.g., oxygen) and evaporated components in electrical discharge plasma within the deposition chamber is favorable for chemical reaction of gas and evaporated species because ionized species are more chemically active. Such deposition mode is referred to as activated reactive evaporation deposition.

In the '044 patent such activated deposition mode occurs only during PA-PVD stages when the substrate bias voltage is applied to the substrate serving as a cathode for the plasma/ion-generating discharge. In various present embodiments, chemical activation of species forming TBC may take place during the stages both of PA-PVD and PVD because the plasma/ion-generating discharge may be maintained during both stages. This is discussed in further detail below. This maintenance of chemical activation allows obtaining stable stoichiometric TBC ceramics during entire deposition process.

Figure 2:
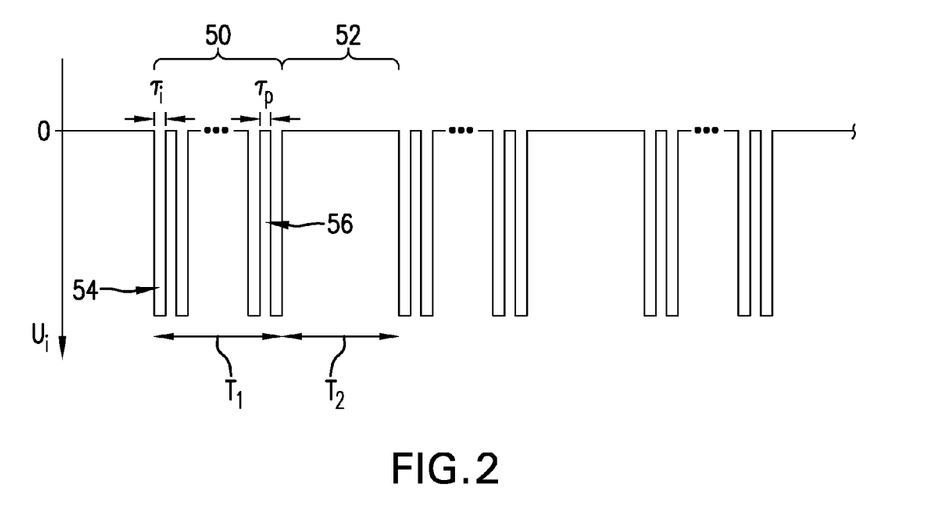
FIG. 2 is a plot of a potential applied to a part to be coated in the system of FIG. 1.

FIG. 2 shows the voltage applied to the substrate in a plurality of alternating PA-PVD intervals 50 and PVD intervals 52. The exemplary PA-PVD intervals 50 each have a duration $T_1$ and the exemplary PVD intervals 52 each have a duration $T_2$. During at least a major portion of the exemplary deposition (i.e., 50% of the TBC thickness) $T_1$ and $T_2$ are constant. Exemplary durations $T_1$ or $T_2$ may be generally similar to that of the '044 patent (e.g., with both in the vicinity of one minute (e.g., 30-120 seconds, more narrowly, 45-75 seconds or, more broadly 10-1000 s)). The exemplary total numbers of the intervals 50 and 52 are between 20 and 200 apiece, more narrowly 30-100 apiece. Exemplary thicknesses applied in each of the layers are 1-15 micrometers, more narrowly 2-10 micrometers or about 5 micrometers. Exemplary total thickness of the layered portion of the TBC is at least 50 micrometers, more narrowly 75-200 micrometers.

However, as a modification to the method of the '044 patent, each PA-PVD interval is further divided into pulses 54 of a negative voltage of magnitude $U_i$ and pulse widths or durations $\tau_i$ separated by intervals 56 of width/duration $\tau_p$ of relatively neutral voltage (e.g., magnitude much less than half of $U_i$ and, more narrowly, less than 10% of $U_i$ or zero). Exemplary $\tau_i$ is less than or equal to 1 millisecond, more narrowly, 50-500 microsecond or 10-100 microsecond. Exemplary $\tau_p$ is greater than or equal to 0.5 microseconds, more narrowly, 10-100 microseconds. An exemplary duty cycle ($D=\tau_i/(\tau_i+\tau_p)$) of the pulses is between 0.1 and 0.99, more narrowly, 0.5-0.95, 0.6-0.9, or 0.8-0.9. Exemplary thickness of the TBC layer (e.g., a 7YSZ layer) is 0.05-1.0 mm, more narrowly 0.1-0.3 mm. The exemplary nominal magnitudes of pulsed substrate bias voltage $U_i$ are 0.5-10 kV, more narrowly 3-5 kV. Exemplary pulse repetition frequency ($F=1/(\tau_i+\tau_p)$) is 0.05-1000 kHz, more narrowly 0.2-20 kHz or 0.5-5 kHz or about 1 kHz.

The reason for dividing each PA-PVD interval into pulses 54 of a negative voltage is to avoid arcing on the substrate surface during the initial time of deposition and further on the fresh coating surface. The arcing arises due to high-voltage substrate bias, oxide nature, and non-regular structure of coated surfaces. The arcing may greatly destroy/damage the substrate and coating surfaces. However, due to the existence of an arcing delay (up to 1 millisecond) from onset of bias voltage application, the system may prevent arcing by breaking off of bias voltage application. Thus, a pulse modulation of bias voltage may prevent arcing. Increase of either the bias voltage or substrate ion current density leads to decrease of arcing delay, therefore the duration $\tau_i$ should be decreased down to some hundreds or tens of microseconds as discussed above.

The duration $\tau_p$ may be chosen to be sufficiently large to ensure restoration of electrical conditions on the coated surface after the bias voltage pulses (e.g., recharging the surface). Exemplary values of pause duration $\tau_p$ were noted above and are less than $\tau_i$. In the '044 patent, practically continuous wave bias voltage is applied to the substrate during the PA-PVD stages as their duration is about 1 min, therefore arcing and its consequences inevitably arise in such processes.

The exemplary intervals 56 ($\tau_p$) are short enough that a glow plasma discharge is maintained between the substrate (as a cathode) and the chamber walls (as an anode) in working gas medium to generate ions which are further accelerated toward the negatively biased substrate to provide the PA-PVD process. The exemplary duty cycles of the bias voltage pulses may provide effective use of time for plasma/ion generation. However such approach to fire and maintain plasma/ion generation discharge (as is also the feature of the '044 patent) has shortcomings because it needs introduction inert gas as addition to oxygen (an inert electrical positive gas, such as argon, facilitates firing and maintaining of the discharge against oxygen (an electrical negative gas)). The excess of inert gas pressure leads to the undesirable effect on TBC microstructure and provokes electrical breakdowns in the evaporating EB gun.

Below, options are discussed for avoiding/reducing employment of inert gases. Frequent interruption (pulse modulation) of the bias voltage in the PA-PVD intervals may have benefit in additional creation of sharp microstructure transitions (obstacles, scattering phonons and photons) and decreasing the TBC thermal conductivity, caused by heat transfer by phonons and photons through TBC. Thus, a many-fold interruption of microstructure growth process may decrease the TBC thermal conductivity by both: alternating PA-PVD/PVD stages; and interruption within PA-PVD stages.

Figure 3:
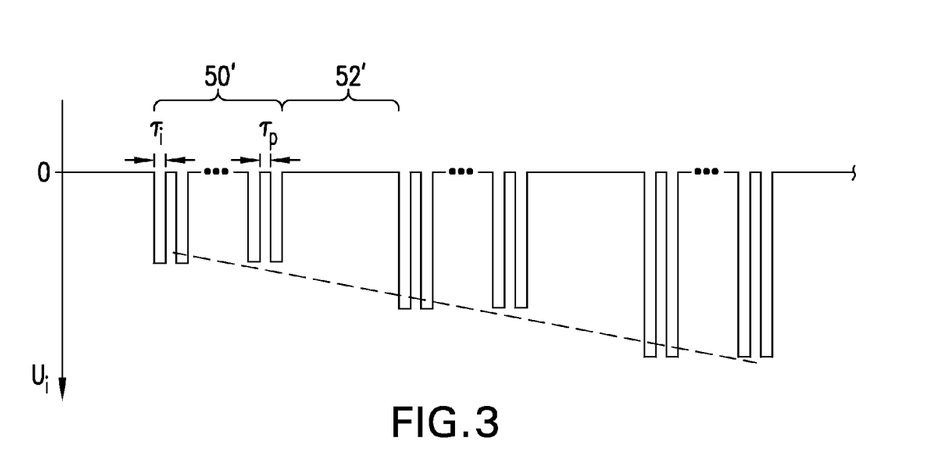
FIG. 3 is a plot of a different potential.

FIG. 3 shows a variation wherein, for at least a portion of the coating process, the magnitude of $U_i$ progressively increases from each interval 50' to the next. In an exemplary implementation, this occurs throughout the entirety of the deposition after any initial transient/start-up interval (e.g., for at least 50% of the total TBC coating thickness). The increase is associated with the influence of the accumulated ceramic coating. As the coating grows during the deposition process, the net insulative effect of the accumulated coating increases, thereby decreasing the ion bombardment effect. The accumulated coating acts as an ever-increasing electrical resistance thereby causing a bigger voltage drop across the coating and a decreased acceleration of the ions bombarding the coating. To compensate for the loss of accelerating voltage and maintain the ion bombardment (e.g., at an essentially constant level) the magnitude of the bias voltage may progressively increase. An exemplary increase is of a factor between 50% and 1000%, more narrowly, 50-500%, or 50-300% over an interval accounting for at least half the thickness of the TBC.

A further variation involves having one or more start up PA-PVD intervals which differ from the majority remainder.

For example, the '044 patent teaches a very first PA PVD interval of a higher voltage magnitude than subsequent PA PVD intervals. The higher magnitude leads to increasing energy of ions bombarding the substrate and facilitates removing contaminants or undesirable oxides from the initial surface (e.g., the surface of the underlying substrate or the surface of the bond coat thereatop) of the substrate prior to TBC deposition, thereby, enhancing TBC adhesion. However such approach provokes arcing on the initially "dirty" substrate surface and inevitably causes frequent and numerous arcs (given the PA-PVD stage duration of about 1 min) and strong damage of the substrate surface and the first TBC layer. Considering the important contribution of features of the first layers in total TBC properties, the system may provide more delicate technologies of ion treating in the initial PA-PVD stages. This is illustrated schematically by FIG. 4, FIG. 5, and FIG. 6.

Figure 4:
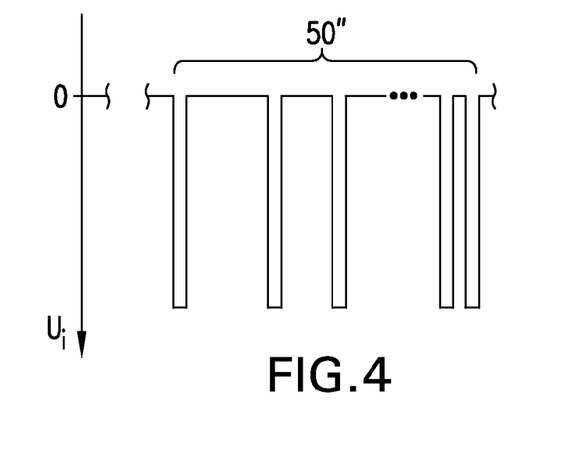
FIG. 4 is a plot of a potential in an alternative PA-PVD deposition phase for the system of FIG. 1.

FIG. 4 shows an increasing duty cycle within a PA-PVD stage 50'' (e.g., the very first stage) at constant pulse voltage. The exemplary duty cycle increase is by 50-900%. In an example, the duty cycle starts at about 0.1 and ends at about 0.9. More broadly, an exemplary start is under 0.5 and finish over 0.7 (or under 0.3 and over 0.8). One may choose a pulse substrate bias voltage magnitude, which is sufficient for ion cleaning of substrate surface (sufficient to destroy of contaminants by ion bombardment). Exemplary values of voltage $U_i$ are noted above. Relatively infrequent bias pulses at the initial period, when arcing is very probable, do not overheat and damage the substrate surface and very thin ceramic layer (to the erosion associated with arcing). Then, with decrease of arcing probability, the system may continuously increase rate of pulses 54 (i.e., increase the duty cycle and input of energy into the interface substrate/growing ceramic film simultaneously with growth of ceramic thickness to provide ion enhancing of the initial ceramic layer adhesion). The values of duty cycle on following PA-PVD intervals may be other than at the first one(s). Ion cleaning becomes a less important effect on the following PA-PVD intervals due to continuous deposition of ceramic material; the more important ion effect is ion modification of the coating microstructure, which was discussed above.

Figure 5:
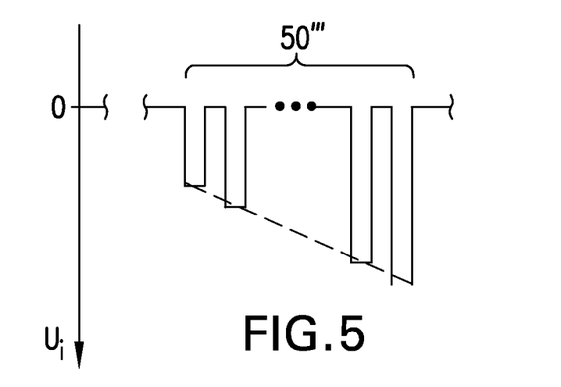
FIG. 5 is a plot of a potential in a second alternative PA-PVD deposition phase for the system of FIG. 1.

FIG. 5 shows an alternative initial PA-PVD interval 50''' wherein the voltage magnitude increases while the duty cycle remains the same. Exemplary ranges of voltage increase are similar to that mentioned for FIG. 3, but measured over the majority of an individual interval. Again in this approach, one may chose the magnitude of the first pulse(s) to be sufficient for ion cleaning of substrate surface (sufficient to destroy contaminants by ion bombardment) but sufficiently low (e.g., 0.5-3 kV as discussed above) to not lead to overheating and damaging the substrate surface and very thin ceramic layer (to avoid the erosion associated with arcing). Then, with decrease of arcing probability, the system may continuously increase amplitude of pulses 54 (i.e., that is increase input of energy into the interface substrate/growing ceramic film simultaneously with growth of ceramic thickness to provide ion enhancing of the initial ceramic layer. The values of bias pulse amplitude on following PA-PVD intervals may be other than at the first ones (e.g. the pulse amplitude may be constant during the remainder of the deposition run). An exemplary increase in pulse magnitude is at least 30% from first to last, more narrowly at least 50%.

Figure 6:
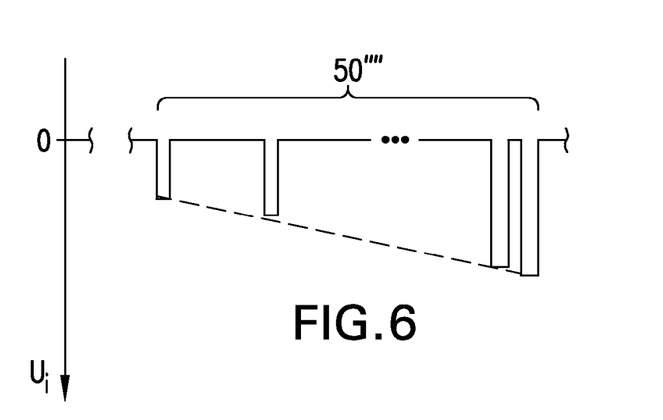
FIG. 6 is a plot of a potential in a third alternative PA-PVD deposition phase for the system of FIG. 1.

FIG. 6 shows an alternative initial PA-PVD interval 50'''' which combines the increasing voltage magnitude and increasing duty cycle of FIGS. 4 and 5, respectively. This progressive change provides a gradual increase in the intensity of ion bombardment to avoid arcing at the beginning of the first PA-PVD stage (when the substrate surface is dirtiest and most-prone to arcing). The ion bombardment tends to clean the surface of contaminants, avoids the erosion associated with arcing, and ensures excellent TBC adhesion. One may choose the value of pulse amplitude at the beginning of the first PA-PVD interval as discussed above. The last technology, illustrated by FIG. 6, may be preferable for cases with very "dirty" initial substrate surfaces inclined to initiate frequent arcs.

Figure 7:
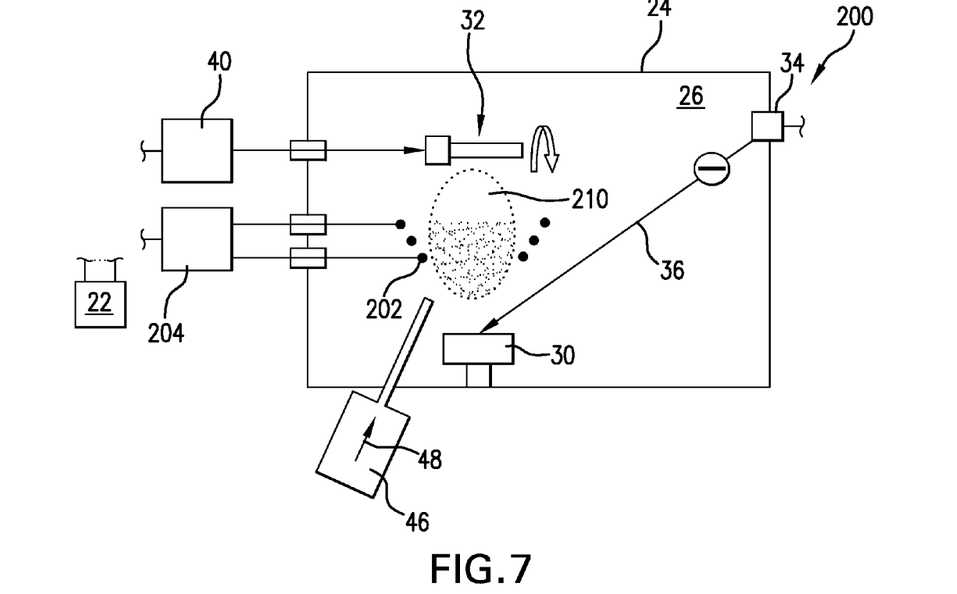
FIG. 7 is a partially schematic view of an alternative coating apparatus/system.

FIG. 7 shows a system 200 which may be otherwise similar to the system 20 and in which similar components have similar numbers. The system further includes an inductor coil 202 coupled to an RF generator 204. The RF generator 204 and inductor coil 202 serve to ionize the ingot vapor and reactive gas and generate a plasma 210. Although a DC ionization source is also possible in place of the RF generator 204, the use of an RF generator is less sensitive to ceramic deposition on the inductor windings because the RF energy is better able to penetrate through dielectric ceramic deposits. The use of RF inductor provides maintaining stable plasma discharge without additional inert gas introduction into the chamber and at lower gas pressures (~1 mTorr) than it was in the '044 patent. As discussed above, this leads to more preferable TBC microstructure for obtaining low heat transfer through TBC and more favorable conditions for EB gun operation.

Figure 8:
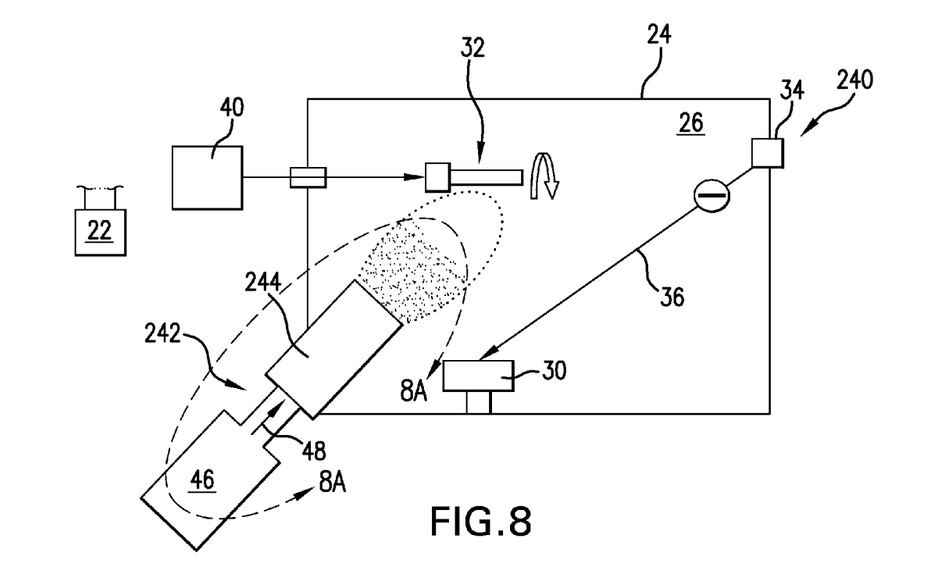
FIG. 8 is a partially schematic view of a second alternative coating apparatus/system.
Figure 8A:
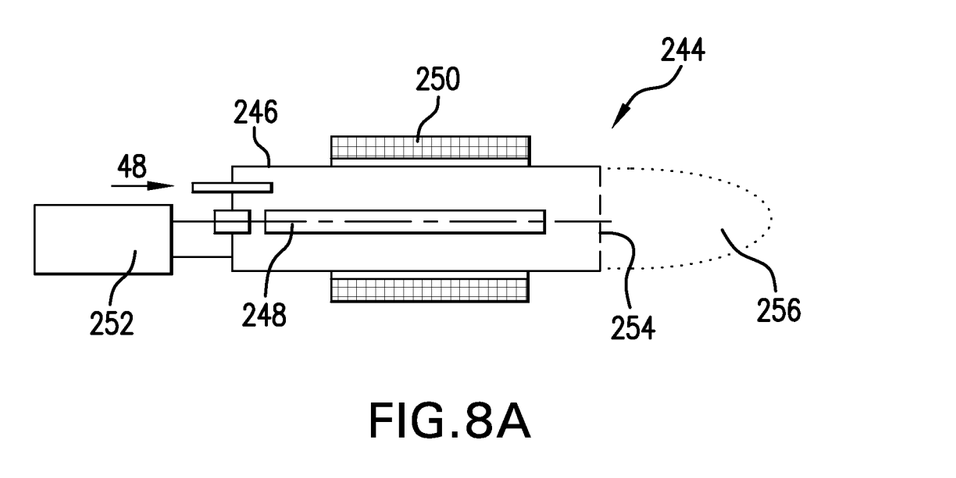
FIG. 8A is an enlarged view of a plasma/ion gun of the system of FIG. 8.

FIG. 8 shows a system 240 which also may be similar to the system 20 but includes a plasma source 242. The exemplary plasma source comprises an plasma/ion gun 244 receiving a flow of reactive gas 48 from the source 46. FIG. 8A shows an exemplary gun 244 with cylindrical electrode maintaining glow or cathode arc discharge for oxygen plasma/ion generation. A first electrode 246 might be a cathode and a second electrode 248 might be an anode. For robustness against the ionized reactive gas the electrodes 246 and 248 may be cold (non-heated) metallic ones. Exemplary metallic discharge electrodes are formed from one or more of the metals in the desired TBC (e.g., Zr and/or Y for the YSZ coating or a desired dopant therefore). To intensify the discharge at very low pressures (≤1 mTorr) and for more uniform wear of the electrodes, a magnet 250, generating an axial magnetic field, may be used. The benefit from the axial magnetic field is caused by azimuth rotation of plasma species and cathode spots. A power source 252 supplies the discharge within the gun 244 by either DC or pulse modulated DC, or AC, or RF, or microwave (MW) energy. The exemplary gun end 254 is an outlet grid wall for plasma/ion flow. Thus, the reactive gas 48 is ionized within the gun 244 with the help of electrical discharge and forms oxygen plasma/ion flow 256 toward the substrate. Use of the gun allows deposition to the carried out at a lower gas pressure than in the basic system.

Figure 9:
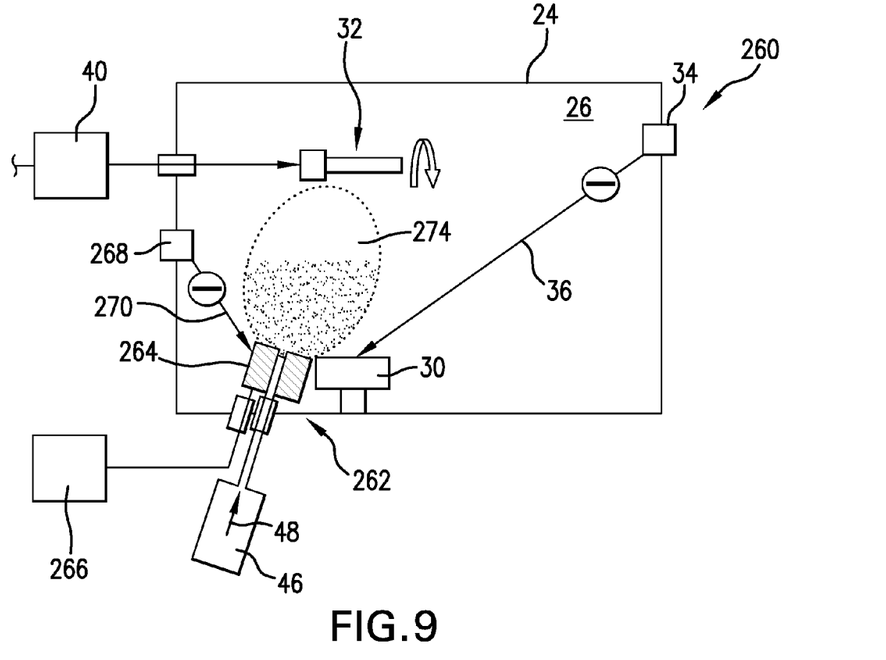
FIG. 9 is a partially schematic view of a third alternative coating apparatus/system.

FIG. 9 shows a system 260 which may be similar to the system 20. The system 260 further includes a hollow cathode arc plasma source (ion gun) 262 for generation of a reactive plasma/ions from the reactive gas 48. The source 262 includes a tube-like cathode 264 and a power source 266 (e.g., DC or pulse modulated DC, or AC, or RF) coupled thereto. An exemplary hollow cathode 264 may be formed of material representing one or more components of the coating and/or ingot. For example, with a YSZ ingot, a YSZ cathode may be used to minimize introduction of impurities. To the extent that a ceramic cathode such as YSZ is electrical conductive at elevated temperatures, a supplemental heater (e.g., an electron beam gun 268 directing an electron beam 270 to the cathode 264) may be provided. FIG. 9 further shows a flow 274 of reactive plasma/ions ejected by the source 262 toward the substrate. Use of the hollow cathode arc plasma source/ ion gun allows deposition to the carried out at a lower gas pressure than in the basic system.

Figure 10:
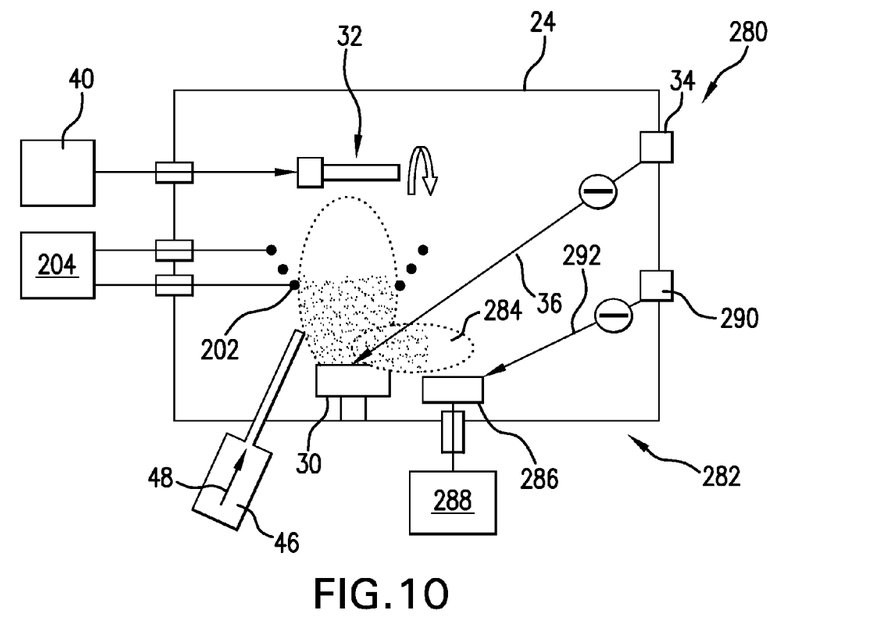
FIG. 10 is a partially schematic view of a fourth alternative coating apparatus/system.

FIG. 10 shows a system 280 which may be generally similar to the system 200 but further including an arc discharge source 282. The exemplary arc discharge source generates a plasma 284 which, in turn, provides charged species to support the induction plasma discharge. The source 282 includes an anode 286 (e.g., a ceramic anode for supporting arc discharge over the evaporated ingot surface; the ingot surface serving as a cathode of the arc discharge). Exemplary anode material is ceramic, more particularly, it may be identical to or otherwise similar to the material of the ingot. A power source 288 (e.g., DC or pulse modulated DC, or AC, or RF) provides power to the anode 286. In a similar fashion to the EB gun 268, an EB gun 290 may act as a heater and emit an electron beam 292 to heat the anode to a temperature where effective electrical conductivity appears in the ceramic of the electrode (anode). Use of the arc discharge plasma source allows deposition to the carried out at a lower gas pressure than in the basic system.

The exemplary systems, schematically shown in FIG. 7-FIG. 10, may be operated without inert gas for firing and maintaining plasma/ion generating discharge; only the reactive gas forming TBC is employed. Via pulse modulation of bias voltage during PA-PVD stages, arcing may be avoided and the value range of bias voltage may be wider than in the '044 patent and the like systems. This may provide effective ion cleaning and ion enhancing of TBC adhesion as well as ion modification of TBC microstructure, resulting in decrease of the TBC thermal conductivity.

One or more embodiments have been described. Nevertheless, it will be understood that various modifications may be made. Details of the particular turbine engine part or other piece and the particular coating material may influence details of any given deposition. Accordingly, other embodiments are within the scope of the following claims.

What is claimed is:

1. A method for applying a material to a part, the method comprising:
   placing the part in a deposition chamber;
   applying a first electric potential to the part;
   evaporating components for forming the material;
   ionizing the evaporated components; and
   modulating the first electric potential so as to draw the ionized components to the part, wherein the modulating comprises:
   a plurality of first steps for PA-PVD, each comprising a series of pulses of negative potential; and
   a plurality of second steps for PVD alternating with the first steps, wherein:
   a pulse width $\tau_i$ is $<10^{-3}$ s;
   a duty cycle D of the pulses is $0.1<D<0.99$;
   a pause between the pulses $\tau_p>0.5\times10^{-6}$ s;
   a duration $T_1$ of each first step is $10<T_1<1000$ s; and
   a duration $T_2$ of each second step is $10<T_2<1000$ s.

2. The method of claim 1 wherein the modulating comprises a stage in which:
   a magnitude of the pulses increases across several of the first steps.

3. The method of claim 2 wherein:
   the magnitude increases by 50-500% relative to the first pulse of the first step.

4. The method of claim 1 wherein:
   the part is a superalloy turbine part and the material is YSZ.

5. The method of claim 1 wherein:
   the ionizing is modulated.

6. The method of claim 1 wherein the material is applied to a thickness of at least 0.05-1.0 mm.

7. The method of claim 1 further comprising:
   generating a plasma with a plasma generator having electrodes and plasma generating oxygen gas source having an outlet directing the plasma-generating oxygen gas toward the substrate.

8. The method of claim 1 further comprising:
   generating a plasma with an arc discharge plasma generator having electrodes formed from the deposition material.

9. The method of claim 8 wherein the arc discharge plasma generator has:
   a first of said electrodes being a ceramic electrode; and
   a heater for heating the ceramic electrode up to temperature of ceramic electrical conductivity appearance.

10. The method of claim 8 wherein:
    the arc discharge plasma generator electrodes are separate from an ingot of the material from which the components are evaporated.

11. The method of claim 1 further comprising:
    providing an arc discharge between an anode and a source of the material.

12. The method of claim 11 wherein:
    the anode is a heated ceramic anode.

13. The method of claim 1 further comprising:
    operating a plasma generator to generate a plasma so as to facilitate the deposition at a pressure less than or equal to one miliTorr.

14. A method for applying a material to a part, the method comprising:
    placing the part in a deposition chamber;
    applying a first electric potential to the part;
    evaporating components for forming the material;
    ionizing the evaporated components; and
    modulating the first electric potential so as to draw the ionized components to the part, wherein the modulating comprises:
    a plurality of first steps for PA-PVD, each comprising a series of pulses of negative potential; and
    a plurality of second steps for PVD alternating with the first steps,
    wherein in at least one of the first steps:
    a nominal voltage of the negative pulses is 0.5-10 kV; and
    a pulse repetition frequency of the pulses is 0.05-1000 kHz.

15. The method of claim 14 wherein in said at least one of the first steps:
    the nominal voltage is 3-5 kV for a majority of the pulses;
    the pulse repetition frequency is 0.5-5 kHz for a majority of the pulses; and
    a duty cycle is 0.8-0.9 for a majority of the pulses.

16. A method for applying a material to a part, the method comprising:
    placing the part in a deposition chamber;
    applying a first electric potential to the part;
    evaporating components for forming the material;
    ionizing the evaporated components; and
    modulating the first electric potential so as to draw the ionized components to the part, wherein the modulating comprises:
    a plurality of first steps for PA-PVD, each comprising a series of pulses of negative potential; and
    a plurality of second steps for PVD alternating with the first steps,
    wherein the modulating comprises a stage in which:
    a magnitude of the pulses increases progressively within at least one of the first steps.

17. The method of claim 16 wherein:
the magnitude increases by 50-500% relative to the first pulse of the first step.

18. A method for applying a material to a part, the method comprising:
placing the part in a deposition chamber;
applying a first electric potential to the part;
evaporating components for forming the material;
ionizing the evaporated components; and
modulating the first electric potential so as to draw the ionized components to the part, wherein the modulating comprises:
a plurality of first steps for PA-PVD, each comprising a series of pulses of negative potential; and
a plurality of second steps for PVD alternating with the first steps,
wherein the modulating comprises a stage in which:
a duty cycle of the pulses increases progressively within at least one of the first steps.

19. The method of claim 18 wherein:
the duty cycle increases by 50-900%.

\* \* \* \* \*